(12) United States Patent
Okabe et al.

(10) Patent No.: US 8,083,456 B2
(45) Date of Patent: Dec. 27, 2011

(54) CONTAINED OBJECT TRANSFER SYSTEM

(75) Inventors: Tsutomu Okabe, Tokyo (JP); Toshihiko Miyajima, Tokyo (JP)

(73) Assignee: TDK Corporation, Tokyo (JP)

( * ) Notice: Subject to any disclaimer, the term of this patent is extended or adjusted under 35 U.S.C. 154(b) by 371 days.

(21) Appl. No.: 12/339,648

(22) Filed: Dec. 19, 2008

(65) Prior Publication Data
US 2009/0175709 A1   Jul. 9, 2009

(30) Foreign Application Priority Data
Jan. 8, 2008   (JP) ................................. 2008-001036

(51) Int. Cl.
*H01L 21/677*   (2006.01)
(52) U.S. Cl. .................. 414/217; 414/222.02
(58) Field of Classification Search .................. 414/217, 414/222.02; 901/50
See application file for complete search history.

(56) References Cited

U.S. PATENT DOCUMENTS

| | | | |
|---|---|---|---|
| 5,788,448 A * | 8/1998 | Wakamori et al. ........ | 414/222.02 |
| 6,224,679 B1 | 5/2001 | Sasaki et al. | |
| 6,331,890 B1 * | 12/2001 | Marumo et al. ............... | 356/369 |
| 6,817,822 B2 | 11/2004 | Tokunaga | |
| 6,996,453 B2 * | 2/2006 | Ahn et al. ..................... | 700/213 |
| 7,438,514 B2 | 10/2008 | Lee et al. | |
| 2004/0069226 A1 * | 4/2004 | Yoshida et al. ............... | 118/715 |
| 2007/0151620 A1 * | 7/2007 | Okabe ............................. | 141/63 |

FOREIGN PATENT DOCUMENTS

| | | |
|---|---|---|
| JP | 11-63604 | 3/1999 |
| JP | 2002-43391 | 2/2002 |
| JP | 2003-45933 | 2/2003 |
| JP | 2006-19726 | 1/2006 |

OTHER PUBLICATIONS

U.S. Appl. No. 12/471,987, filed May 26, 2009, Okabe, et al.

* cited by examiner

*Primary Examiner* — Saul Rodriguez
*Assistant Examiner* — Glenn Myers
(74) *Attorney, Agent, or Firm* — Oblon, Spivak, McClelland, Maier & Neustadt, L.L.P.

(57) ABSTRACT

A so-called transfer chamber in a semiconductor processing apparatus in which an FIMS system is secured is separated into a second chamber in which a transfer robot is disposed and a first chamber that is minute and includes a door capable of holding a cap of a pod as the FIMS system. In the second chamber, higher pressure than in the first chamber is maintained by a minute amount of nitrogen. In the first chamber, usually, a down flow of clean air is used via the FFU. When the wafer is transferred, a down flow of nitrogen is used. Thus, oxidation gas in the transfer chamber and released substances caused the FFU can be decreased.

7 Claims, 2 Drawing Sheets

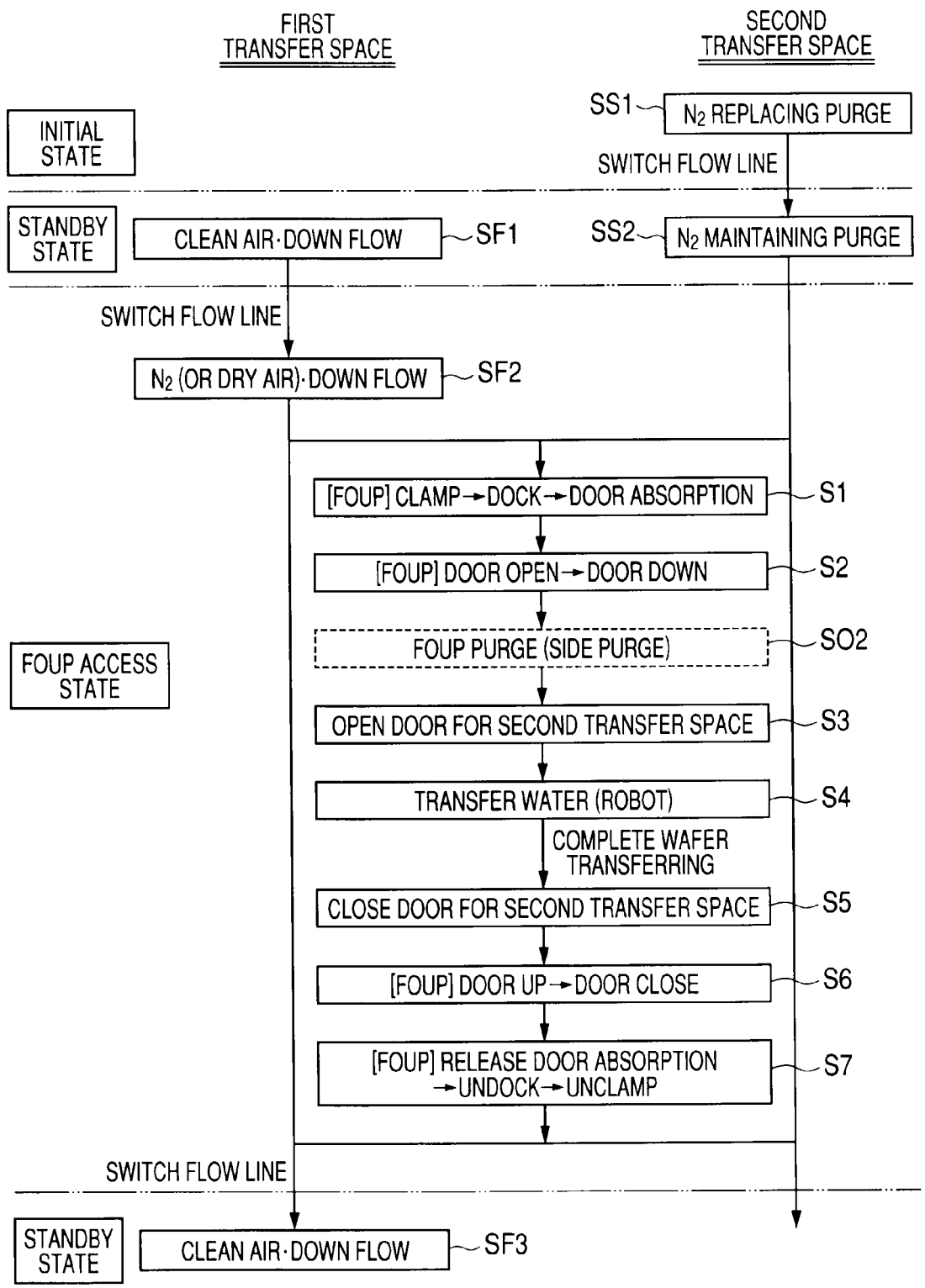

CONTAINED OBJECT TRANSFER SYSTEM

BACKGROUND OF THE INVENTION

1. Field of the Invention

The present invention relates to a so-called FIMS (Front-Opening Interface Mechanical Standard) system used when transferring a contained object, for example a wafer, held in a transfer container referred to as a pod between semiconductor processing apparatuses in semiconductor production processing, to a contained-object transfer system for transferring the contained object between the semiconductor processing apparatuses, and more specifically to a contained-object (wafer) transfer system including an FIMS system in which a pod referred to as a so-called FOUP (Front-Opening Unified Pod) that is a sealed container for containing the wafer is placed and a cap of the pod is opened/closed to transfer the wafer from/into the pod and a transfer chamber that has a mini-environment connected to the FIMS system and is provided with a robot for transferring the wafer therein.

2. Related Background Art

Semiconductor production processing used to be performed in a so-called clean room whose inside is highly purified for dealing with a semiconductor wafer. However, in view of addressing the increased sizes of wafers and cost cutting for controlling the clean room, in recent years, a method has being employed in which only an inside of a processing apparatus, a pod (container of wafer), and the mini-environment for accommodating a transfer robot that hands over the wafer from the pod to the processing apparatus are kept in a highly purified state.

The pod includes a main unit in a shape of a substantial cubic that has a shelf therein capable of holding a plurality of wafers disposed at a space in parallel and an opening provided on one of surfaces forming outer surfaces out of/into which the wafer is taken/put, and a cap for closing the opening. A pod having the opening not formed on a bottom surface thereof but on one side surface (a surface facing the mini-environment) thereof is generally referred to as the FOUP. The present invention is mainly addressed to structures using the FOUP.

The above-described mini-environment includes a first opening portion facing an opening of the pod, a door closing the first opening portion, an opening portion at a semiconductor processing apparatus provided for the processing apparatus, a transfer robot that enters an inside of the pod through the first opening portion to hold the wafer and passes through the opening portion at the processing apparatus to transfer the wafer to the processing apparatus. A structure forming the mini-environment includes a placing base supporting the pod such that the opening portion of the pod exactly faces a front face of the door.

On an upper surface of the placing base, there is provided a positioning pin that is fixed into a hole for positioning and disposed on a bottom surface of the pod to regulate a placing position of the pod and a clamp unit that is engaged with a clamped portion and disposed on the bottom surface of the pod to secure the pod onto the placing base. In general, the placing base can be moved a predetermined distance forward and backward with respect to the direction of the door. In order to transfer the wafer disposed in the pod into the processing apparatus, the pod is moved until a cap thereof contacts the door with the pod placed on the placing base. After the cap contacts the door, the cap is removed by the door from the opening portion of the pod. By means of these operations, the inside of the pod and the inside of the processing apparatus are in communication via the mini-environment, and sequential transferring operations of the wafers are repeatedly performed. The placing base, door, first opening portion, opening/closing mechanism of the door, wall that is provided with the first opening portion therein and forms a part of the mini-environment are generally referred to the FIMS system.

In general, the inside of the pod containing the wafer is filled with dried nitrogen controlled to be highly purified so that contaminated subjects and oxidation gas are prevented from entering the pod. However, when bringing the wafer disposed in the pod into various processing apparatuses to perform a predetermined processing, the inside of the pod and the insides of the processing apparatuses are always kept connected together. According to Japanese Patent Application Laid-Open No. 2006-019726, a fan and a filter are disposed above a chamber where a transfer robot is provided and purified air including controlled particles is generally fed into the chamber. However, when such air enters the pod, a surface of the wafer can be oxidized by oxygen or moisture in the air.

Along with the decreased sizes of semiconductor elements and enhanced performances thereof, more attention has been put on oxidization by the oxygen entering the pod, which has not been conventionally considered as a serious problem. The oxidation gas described above forms a very thin oxidized film on the surface of the wafer or on various kinds of layers formed on the wafer. An existence of such an oxidized film can make it impossible to ensure desired characteristics of the micro semiconductor element. In order to address the problem, it is considered to inhibit the gas in which oxygen partial pressure is not controlled from entering the pod from the outside thereof. As a more specific method, Japanese Patent Application Laid-Open No. 2003-045933 discusses a structure in which a gas supplying nozzle and a gas sucking nozzle are provided in a region near the opening of the pod in the FIMS system to form an air current film for substantially closing the opening of the pod. The formation of the air current film prevents gas entering from the outside of the pod into the inside thereof.

However, for the so-called mini-environment where the transfer robot is disposed, merely general air in which only dust is controlled through a filter is supplied. Therefore, when the wafer is transferred from or into the pod, the wafer always passes through circumstance in which the oxidation gas is not controlled. This transfer operation is actually performed in a very short time, and has not caused such a serious problem in the current process of producing the semiconductors. However, moisture as a phenomenon of condensation can adhere onto the surface of the wafer even in a short time. Once the moisture adheres, it is difficult to inhibit various kinds of thin films from being oxidized.

SUMMARY OF THE INVENTION

In view of the above-described background, the purpose of the present invention is to provide a transfer system of a wafer that is a contained object enabling partial pressure of oxidation gas such as oxygen to be inhibited to a predetermined low level in a space where the wafer exists, even after the pod is released and when the wafer is transferred. More specifically, the purpose of the present invention is to provide the transfer system for opening the cap of the pod that contains the wafer, taking out the wafer from the pod to transfer the wafer to the processing apparatus, transferring the wafer that has been transferred from the processing apparatus into other pod again, and enabling these operations to be performed under the circumstance where the oxidation gas is decreased as much as possible.

In order to solve the problems, a transfer system for a contained object according to the present invention that transfers the contained object between a container and a processing chamber in which processing is performed on the contained object, the container being capable of containing the contained object therein and including a main unit in a substantially box-like shape having an opening on one face thereof and a cap capable of being separated from the main unit and closing the opening to form a sealed space together with the main body, and the cap being removed from the container to open the opening so that the contained object is able to taken out of/put into the container, the transfer system includes a placing base on which the container is placed, a first chamber that is disposed adjacent to the placing base and includes a first opening portion facing the container placed on the placing base, a first door capable of closing the first opening portion and holding the cap of the container, a fan filter unit capable of supplying clean air into a first chamber disposed above the first chamber, a first inert-gas supply system that is disposed above the first chamber dependently from the fan filter unit and capable of supplying inert gas into the first chamber, a first discharge system capable of discharging gas existing in the first chamber, a second chamber that is disposed adjacent to the first chamber, capable of connecting to the first chamber via a second opening portion, and capable of connecting to the processing chamber via a third opening portion, a second door capable of closing the second opening portion, a second inert-gas supply system capable of supplying inert gas into the second chamber, a second discharge system capable of discharging gas existing in the second chamber, a transfer robot that is disposed in the second chamber and transfers the contained object between an inside of the container and the processing chamber, and a control apparatus that enables the clean air to be supplied from the fan filter unit into the first chamber in a state where the container is not placed on the placing base and stops supplying the clean air from the fan filter unit and enables gas to be supplied from the first inert-gas supply system upon detecting a state where the container is placed.

The transfer system described above further includes a shutter member that is disposed near an outlet of the clean air from the fan filter unit and capable of spacially separating the outlet from the first chamber, and it is preferred that the control apparatus stops supplying the clean air from the fan filter unit and enables the shutter member to spacially separate the outlet from the first chamber. Further, it is preferred in the transfer system that the second inert-gas supply system has a supply mode of a large flow amount for supplying the inert gas with a large flow amount into the second chamber and a supply mode of a small flow amount for supplying the inert gas with a small flow amount into the second chamber in order to maintain a purity level of the inert gas in the second chamber.

Furthermore, it is preferred in the transfer system described above that, when the second inert-gas supply system supplies the inert gas into the second chamber in the supply mode of the small flow amount, the control apparatus controls at least either one of the second inert gas supply system or the second discharge system to maintain pressure within the second chamber being higher than pressure within the first chamber. Or, it is preferred that the second inert-gas supply system supplies inert gas to the second chamber with a small flow amount in order to maintain the purity level of the inert gas in the second chamber, and that the control apparatus enables the second door to open the second opening portion and the first discharge system to stop a discharge operation, and has a purge mode for feeding the inert gas supplied from the first inert gas supply system into the second chamber via the first chamber. Moreover, in addition to the components described above, it is further preferable that a plurality of first chambers are provided, and the fan filter unit, the first inert-gas supply system, the second opening portion, and the second door are each provided for each of the first chambers.

According to the present invention, the space where the transfer robot for transferring the contained object is provided can be always filled with the inert gas including controlled oxidation gas such as the so-called dried nitrogen. Accordingly, various kinds of composing films can be greatly inhibited from oxidization, which has caused problems in the conventional structures when the wafer is transferred. Further, in a case where the gas is changed to nitrogen for being fed to the transfer chamber in the conventional structures, such problems as an amount of nitrogen for use becomes enormous and another problem is how to process the fed nitrogen into the chamber may arise. However, according to the present invention, the transfer chamber is separated into the first chamber and the second chamber and only the first chamber that is much smaller than the other chamber in volume of the space is used to operate so-called nitrogen purge to open/close the cap of the container. When the nitrogen purge is performed, generally, a large amount of nitrogen is required. However, since the operation is performed in a small space, the total amount of nitrogen for use can be inhibited, and thus the above-described problem can be solved.

Further, according to the present invention, the first chamber is provided with two systems of a system for generating a down flow through a so-called fine filter unit (FFU) and a system for supplying nitrogen for performing the nitrogen purge in the chamber. Boron (B), for example, that is a component of the filter can be released due to a structure of the FFU. If the released boron is adhered onto a surface of the wafer by the down flow while the wafer is transferred, the adhered released boron is taken into a semiconductor layer when forming an element and causes a threshold value for on/off of the semiconductor element to be shifted. Conventionally the possibility described above does not matter, however, in order to produce finer semiconductors having higher performances, the possibility can cause the problems in the future. According to the present invention, the down flow is formed in the nitrogen purge system without passing through the FFU in order to inhibit the released boron from being taken into the down flow while the wafer is transferred. Accordingly, possibility in which impurities such as released boron reach the wafer can be decreased.

The above and other objects, features, and advantages of the invention will become more apparent from the following detailed description taken in conjunction with the accompany drawings.

BRIEF DESCRIPTION OF THE DRAWINGS

FIG. 2 is a flowchart illustrating an actual operation of the contained-object transfer system according to the exemplary embodiment of the present invention.

DESCRIPTION OF THE PREFERRED EMBODIMENTS

Figure 1A:
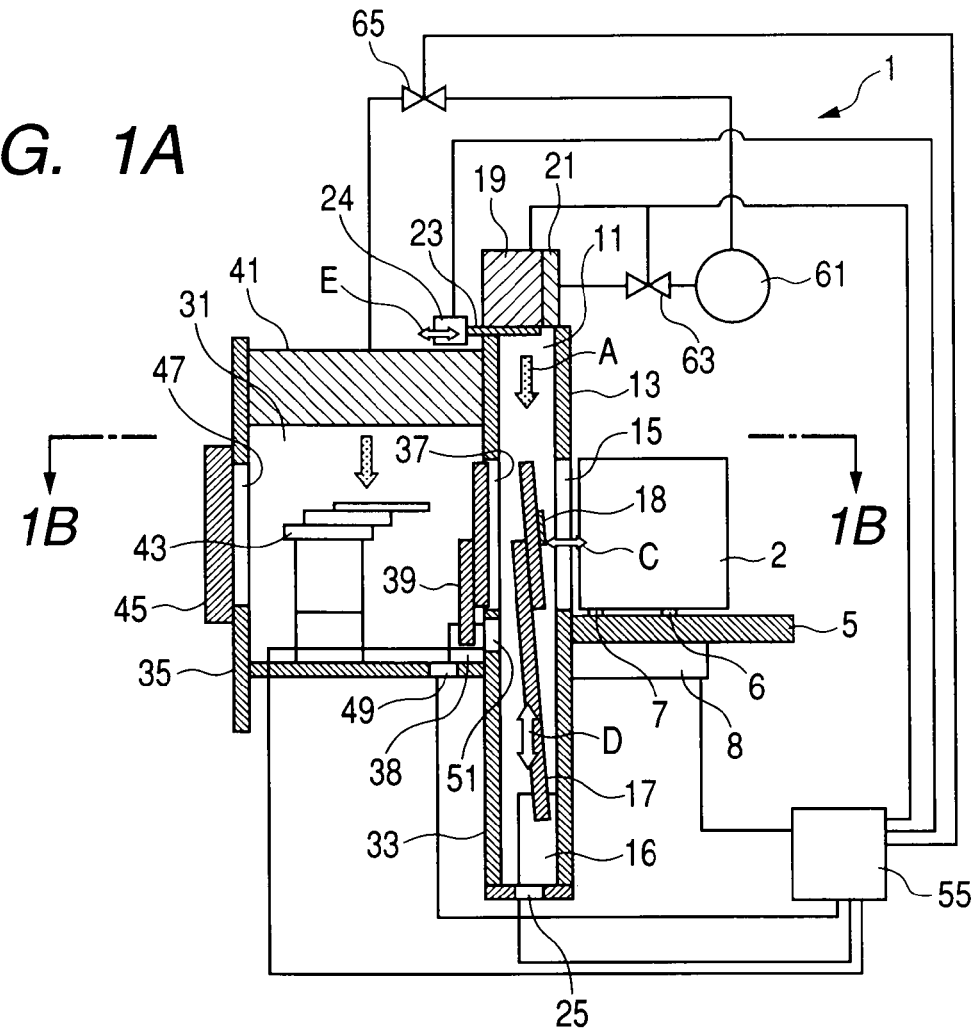
FIG. 1A is a diagram schematically illustrating a substantial structure of essential parts of a contained-object transfer system according to the exemplary embodiment of the present invention.
Figure 1B:
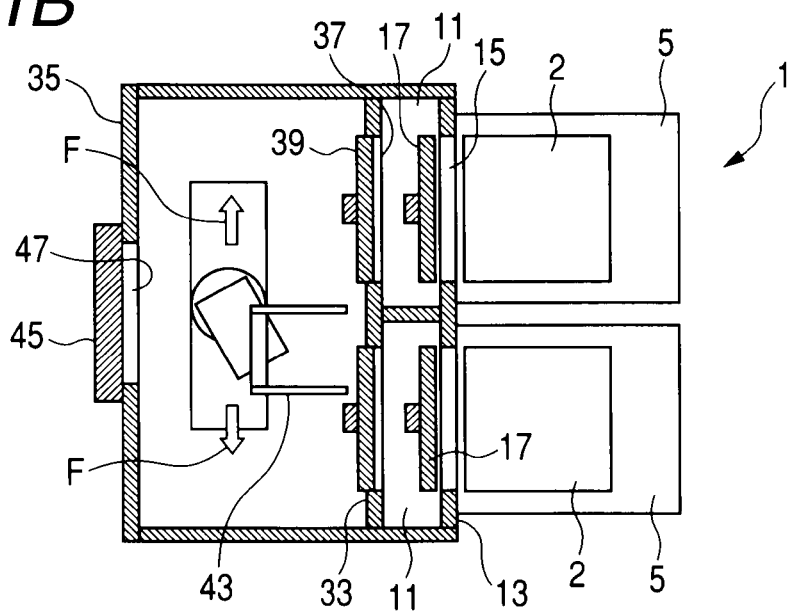
FIG. 1B is a diagram schematically illustrating a substantial structure, viewed from above, of a cross section taken along line 1B-1B of FIG. 1A.

With reference to figures, exemplary embodiments of the present invention will be described below. FIG. 1A is a diagram schematically illustrating a structure of essential parts of a transfer system of wafers that are contained objects according to the exemplary embodiment of the present invention. That is, cross sections taken in a vertical direction of a structure in the above-described FIMS, structures of the mini-environment and the transfer robot, and other structures added to the present invention along with the structures described above are schematically illustrated. FIG. 1B schematically illustrates an upper face of essential parts of the system taken along line 1B-1B of FIG. 1A. Each structure in the figure including a placing base, a door, and the like in the FIMS portion actually accompanies various structures for driving the FIMS portion. However, basically, the structures such as a driving system are not directly related to the present invention and, further, can be replaced with a so-called known driving system such as a fluid cylinder, and therefore detailed illustrations and descriptions will be omitted here.

Now, a pod that is a container in the present invention and a wafer that is a contained object to be contained in the pod in the present invention will be described in advance. In the main unit of the pod, there is formed a space for containing the wafer therein. The main unit has a shape of a substantial box including an opening in a shape of substantial rectangular on either one of surfaces in a horizontal direction. Further, the pod is provided with a cap for closing the opening of the main unit as a separated member. In the main unit, there is provided a shelf including a plurality of steps for horizontally keeping each of a plurality of wafers and vertically stacking the wafers in a case where the pod is placed on a horizontal face in a normal state. The wafers placed on the shelf are contained in the main unit of the pod having a constant interval therebetween.

The wafer transfer system 1 according to the present invention includes a placing base 5 on which a pod 2 is loaded, a first chamber 11 and a structure accompanying the first chamber, a second chamber 31 and a structure accompanying the second chamber, and a control apparatus 55 that collects information from the structures and controls the structures. The first chamber 11 includes a first partition wall 13, a first opening portion 15, a first door 17, a fine filter unit (FFU) 19, a first inert-gas supply system 21, an FFU shutter 23, and a first discharge port 25. Further, the second chamber 31 includes a second partition wall 33, a third partition wall 35, a second opening portion 37, a second door 39, a second inert-gas supply system 41, and a transfer robot 43. A third partition wall 35 is provided with a third opening portion 47 that can be connected to a processing chamber (not illustrated) via a processing chamber-door 45.

The placing base 5 includes positioning means 6 formed of, for example, a pin that can work in concert with a structure in which the positioning means 6 is disposed on a bottom surface of the pod and securing means 7 formed of a clamp member so that the pod 2 to be disposed on a top surface of the placing base 5 can be secured at a predetermined position. The pod 2 is placed on the placing base such that an opening of the pod 2 faces the first opening portion 15 at the first chamber 11 having a predetermined distance therebetween at the predetermined position. The placing base 5 includes a pod driving mechanism 8 that enables the pod 2 to move to or move away from the first opening portion 15. Accordingly, the pod 2 loaded to at the predetermined position on the placing base 5 is moved to the first opening portion 15 by the pod driving mechanism 8. Now, when a control apparatus 55 detects a state where the pod 2 is placed on the placing base 5, the control apparatus 55 determines that an operation of transferring the wafer is to be performed and prompts various operations for transferring the wafer to be performed under adequate circumstance described below. Therefore, placing the pod 2 on the placing base 5 is recognized as an operation for generating a signal for starting the wafer transfer operation, in the present invention. The positioning means 6, the securing means 7, and the pod driving mechanism 8 form an essential structure for the wafer transfer system according to the present invention, however, it is not characteristic structure of the present invention. Since various modifications can be performed, the above-described parts are simply illustrated in FIGS. 1A and 1B. Further, specific descriptions about its structure will be omitted.

The first opening portion 15 has an enough size enabling the cap closing the opening of the pod 2 to pass therethrough and a wall surrounding the opening of the cap body to face the first opening portion 15. The first door 17 can be moved between an initial state for substantially closing the first opening portion 15 and a containing state for completely opening the first opening portion 15. The first door 17 includes a cap holding mechanism 18 for holding the cap on a surface where the first door 17 abuts on the cap. In the initial state, when the cap of the pod 2 abuts on the first door 17, the first door 17 holds the cap and separates the cap from the pod 2 secured on the placing base 5, and moves back to the containing position together with the cap. More specifically, in order to put off and put back the cap, the first door 17 acts as illustrated by an arrow C in the figure, and acts from a state where the cap is put off along a direction of an arrow D in the figure to move to the containing position. The action along the directions of the arrows C and D are performed by a first door-driving mechanism 16 connected to the first door 17.

On a top surface of the first chamber 11, the fan filter unit 19 is disposed. At a lower portion of the first chamber 11, there is provided the first discharge port 25 connected to a first discharge system (not illustrated) that can discharge an amount of gas adequate to an amount of clean air (so-called purified air in which the dust is controlled) to be fed from the fan filter unit 19. The control apparatus 55 appropriately controls an amount of purified air to be fed from the fan filter unit 19 and an amount of air to be led to an outside from the first discharge port 25 and a gap between the first door 17 and the first opening portion 15 so that inside pressure in first chamber 11 is to be higher than pressure of an outer space, that is, atmospheric pressure. According to the present exemplary embodiment, the first door 17 dose not completely close the first opening portion 15, however, a pressure difference can substantially prevent the gas from entering the first chamber 11 from the outer space. Therefore, in the present invention, descriptions will be made on the assumption that the first door 17 closes the first opening portion 15, hereinafter. Further, a path for the gas discharged from the first chamber 11 to the outer space includes the gap formed between the first door 17 and the first opening portion 15 described above, as well as the first discharge port 25 from which the control apparatus 55 can change an amount of the gas to be discharged. Thus, the gas discharge path in the first chamber 11 including the discharge paths described above are generally regarded as a first discharge system.

The first chamber 11 further includes the FFU shutter 23 and the first inert-gas supply system 21. The FFU shutter 23 accompanies a shutter driving mechanism 24. The shutter driving mechanism 24 moves the FFU shutter 23 along a direction of an arrow E in the figure between two positions of the containing position having no impact on the internal space in the first chamber 11 and the closing position for spacially separating the fan filter unit 19 from the first chamber 11 by moving below the fan filter unit 19. The first inert-gas supply system 21 is disposed above the first chamber 11 similarly to the fan filter unit 19. The disposition is determined so that, in a state where the FFU shutter 23 spacially separates the fan filter unit 19 from the first chamber 11, inert gas (hereinafter, nitrogen is described as an example) can be supplied into the first chamber 11. According to the present exemplary embodiment, the first inert-gas supply system 21 is simply disposed at a front side of the first chamber 11, and the fan filter unit 19 is disposed at a rear side thereof. However, as long as the conditions described above are satisfied, the disposition is not limited to the present exemplary embodiment. The first inert-gas supply system 21 is connected to an inert-gas supply source 61 via a first supply-amount control valve 63. In a state where the control apparatus 55 stops supplying the clean air from the fan filter unit 19 to the first chamber 11, the first supply-amount control valve 63 controls an amount of nitrogen to be supplied so that the amount of nitrogen equivalent to that of the clean air supplied from the fan filter unit 19 can be supplied into the first chamber 11.

In general, the FFU supplies the clean air into a lower space in the system. However, a composing substance of the FFU can be released. The released substance is conveyed by a down flow generated by the FFU and can be adhered onto the wafer that is transferred in the down flow. According to the present invention, in a so-called stand by state where the first door 17 closes the first opening portion 15, the dust in the first chamber 11 is controlled using the down flow (current illustrated by an arrow A) generated by the fan filter unit 19. Upon a transfer operation of the wafer, the control apparatus 55 stops supplying the purified air from the fan filter unit 19. At the same time, the control apparatus 55 enables the FFU shutter 23 to protrude to near an outlet of the clean air at a bottom of the fan filter unit 19 to spacially separate the outlet of the fan filter unit 19 from the first chamber 11 by the FFU shutter 23. Further, the control apparatus 55 enables the first inert-gas supply system 21 to supply nitrogen with the amount equivalent to the amount from the fan filter unit 19. As a result of changing the gas to be supplied by such an operation, without passing the fan filter unit 19, nitrogen in which a level of purifying the dust and partial pressure of oxidation gas are controlled can be supplied into the first chamber 11 and thus the down flow can be formed by the nitrogen. Therefore, the possibility in which the released substance out of the fan filter unit 19 reaches the wafer can be greatly decreased. Further, nitrogen is used only for a required minimum period when the wafer is actually being transferred and thereby an effect that an amount of nitrogen used is decreased to the required minimum amount can be obtained.

The first door 17 separates the cap of the pod 2 from the main unit thereof to enable the inside of the pod and the inner space of the wafer transfer system to be in communication with each other. The first chamber 11 is provided for separating and ensuring a space for operating the first door 17 from the second chamber 31 that is a space for disposing the transfer robot 43. Accordingly, the first chamber 11 may have only a thickness including a span in which the cap is moved into the chamber by a separation operation and an error of an actual operation, a width for substantially closing the first opening portion 15, and a depth for ensuring the space for storing the first door 17 when the first opening portion 15 is opened. Therefore, as illustrate in FIG. 1B, in a case where the wafer transfer system is structured to deal with a plurality of the pod 2, the first chamber 11 is provided corresponding to each placing base 5 on which the pod 2 is placed. The first door-driving mechanism 16 driving the first door 17 in directions of arrows C and D, the cap holding mechanism 18 provided on the first door 17, and the shutter driving mechanism 24 driving the FFU shutter 23 form an essential structure for the wafer transfer system according to the present invention, however, it is not characteristic structure of the present invention. Since various modifications, for example into a fluid cylinder, can be performed, the above-described parts are simply illustrated in FIGS. 1A and 1B. Further, specific descriptions about its structure will be omitted.

The second opening portion 37 has an enough size for the transfer robot 43 to take out/put the wafer from/into the inside of the pod 2 and also take out/put the wafer from/into the sequential processing chambers. The second opening portion 37 basically has the size equivalent to that of the first opening portion 15, and is disposed at a position where the second opening portion 37 can face the first opening portion 15. For each of the second opening portion 37, there is disposed the second door 39 that is operated between two positions for closing and opening the second opening portion 37. The second door-driving mechanism 38 drives the second door 39. The second door-driving mechanism 38 forms an essential structure for the wafer transfer system according to the present invention, however, it is not characteristic structure of the present invention. Since various modifications, for example into a fluid cylinder, can be performed, the above-described parts are simply illustrated in FIGS. 1A and 1B. Further, specific descriptions about its structure will be omitted.

According to the present exemplary embodiment, similar to the relationship between the first door 17 and the first opening portion 15, in a state where the second door 39 exists at a position for closing the second opening portion 37, each of sizes of the second door 39 and the second opening portion 37 is set such that a gap is generated between the second door 39 and an inner circumference of the second opening portion 37. Owing to the relationship of the sizes, the dust caused when each members contacts to each other can be inhibited. In general, pressure differences among the second chamber 31, the first chamber 11 and an outer space are provided to prevent a current from flowing from a space having a low level of purification to a space having a high level thereof. However, the pressure differences may cause a disturbed flow around the door upon an opening/closing operation of the door, and a current heading for a direction that is not intended may be generated. Thus, such a gap is provided to inhibit the pressure from rapidly changing between chambers even upon the opening/closing operation of the door. Occurrence of the disturbed flow can be prevented, and accidental dispersion of the dust caused by the disturbed flow can be inhibited.

An amount of nitrogen supplied to the second chamber 31 is set such that the pressure in a second chamber can be maintained to be higher than that in the first chamber, considering an amount of leakage from a second discharge port 49 or a third discharge port 51 described below that adjusts the above-described gap around the second door 39 and an opening level of the second door 39. By the relationship between the amount of nitrogen supplied to the second chamber and that in the first chamber or that of the air from the fan filter unit 19, the pressure in each chamber is maintained such that the pressure is highest in the second chamber 31, followed by the first chamber 11, and lowest the atmosphere. According to the present exemplary embodiment, the second door 39 dose not completely close the second opening portion 37, however, the pressure difference can actually prevent the gas from entering the second chamber 31 from the first chamber 11. Therefore, for the present invention, descriptions will be made on the assumption that the second door 39 closes the second opening portion 37, hereinafter. Further, a path for discharging the gas from the second chamber 31 to the outer space and the first chamber 11 includes the gap formed between the second door 39 and the second opening portion 37 described above, as well as the second discharge port 49 and the third discharge port 51 from which the control apparatus 55 can change an amount of the gas to be discharged. Thus, the discharge path in the second chamber 31 including the discharge paths described above are generally regarded as a second discharge system.

At a center of the second chamber 31, the transfer robot 43 for actually transferring the wafer is disposed. The transfer robot 43 can move parallel in a vertical direction robot arms extending in a horizontal direction so that the robot arms can be inserted under each wafer aligned in the vertical direction in the pod 2. According to the present exemplary embodiment, since the wafer is taken out from/put into single processing chamber, at an initial position, the transfer robot 43 is disposed to face the third opening portion 47 connecting the second chamber 31 and the processing chamber to each other. Taking the above-described position as a reference, the robot 43 can move in a direction in which the first chambers 11 are disposed in parallel (direction illustrated by an arrow F in the figure.). A processing-chamber door 45 closes the third opening portion 47. Since, various kinds of processing are performed in the processing chambers under a circumstance of decreased pressure such as so-called vacuum, the processing-chamber door 45 completely closes the third opening portion 47 to separate the second chamber 31 from the processing chamber.

On a top surface f the second chamber 31, a second inert-gas supply system 41 is disposed. The second inert-gas supply system 41 is connected to the inert-gas supply source 61 via a second supply-amount control valve 65. Nitrogen is distributed to the system via a single tubular member. A so-called branching tube, or dispersing plate is interposed in a process in which a gas piping is connected between the tubular member and the second chamber 31. This arrangement enables the gas supply system 41 to be formed such that nitrogen can be supplied in a shower-like stream from all over the top surface of the second chamber 31. Further, at a lower portion of the second chamber 31, the second discharge port 49 and the third discharge port 51 are disposed. The second discharge port 49 forms a path for directly discharging the gas existing in the second chamber 31 to the outer space, and can open/close according to an instruction from control apparatus 55 corresponding to a supply mode of the gas to the second chamber 31. Further, the third discharge port 51 forms a path for connecting the second chamber 31 to the first chamber 11 and can open/close corresponding to the supply mode of the gas similarly to the second discharge port 49.

Further, the second supply-amount control valve 65 has two kinds of nitrogen supply modes that are a supply mode of a large flow amount and a supply mode of a small flow amount. The supply mode of a large flow amount is used for purging second chamber 31. In the supply mode of a large flow amount, a down flow by a large amount of nitrogen is generated from the top surface of the second chamber 31 such that the nitrogen can be discharged from the second discharge port 49 disposed at the lower portion of the second chamber 31. This down flow discharges the dust existing in the second chamber 31 with the nitrogen from, for example, the second discharge port 49 to the outer space to ensure purified circumstance within the second chamber 31. On the other hand, the supply mode of a small flow amount is used to maintain high concentration of nitrogen within the second chamber 31 after purification is completed for discharging the dust, and to dilute oxidation gas such as moisture adhered onto an inside wall of the second chamber 31. Therefore, in the supply mode of a small flow amount, only an amount of nitrogen equivalent to that of nitrogen leaked through, for example, the third discharge port 51 or a gap between the second door 39 and the second opening portion 37, or through both described above into the first chamber 11 is supplied. That is, nitrogen enough to be able to maintain a predetermined pressure within the second chamber 31 is supplied. Further without providing the second discharge port 49, in the supply mode of a large flow amount, with the second door 39 and the third door 45 opened, a purge operation may be performed using the discharge system in the first chamber 11 or the processing chamber. Furthermore, without providing the third discharge port 51, the supply mode of a small flow amount may be adopted so that only an amount of nitrogen enough to cause leakage through a gap between the second door 39 and the second opening portion 37 is supplied.

According to other exemplary embodiment, the second supply-amount control valve 65 for supplying nitrogen to the second chamber 31 may be adopted to ensure only a flow amount of nitrogen enough to maintain pressure within the chamber to be a predetermined value after completing the purge operation therein. In this case, the first inert-gas supply system 21 that can normally afford a great flow amount of nitrogen may be used for the nitrogen purge operation in the second chamber 31. Further, in this case, it is preferred that the second discharge port 49 is used while the second door 39 is opened. According to the operation, since the nitrogen for the purge forms a flow heading for the second discharge port 49 from the first chamber 11 via second chamber 31, the nitrogen do not stagnate in the second chamber 31, resulting in performing the efficient and effective purge.

According to the above-described exemplary embodiment, the nitrogen purge is to be performed for a space in the pod 2 along with the purge operation in the first chamber 11. However, when the pod is closed for example, concentration of nitrogen may need to be rapidly increased, if possible, to be higher than that in the first chamber 11. In this case, for example, a nozzle for supplying nitrogen may be disposed around the first opening portion 15 to directly supply nitrogen to the inside of the pod from the nozzle.

Generally, in a supply line of inert gas, a filter is disposed in order to remove microparticles from the gas after the line is branched off from a gas source. According to the present invention, a filter is disposed at the upper portion of the chamber or near the chamber for the purpose of removing oxidation substances such as moisture and released substances including impurities such as boron that can be generated by the gas that has a certain extent of flowing speed or higher passing through the filter. Thus, the first and second inert gas supply systems according to the present invention do not exclude the normal filter disposed near the gas source disposed away from the chambers. Further, when the released substances further cause problems, a so-called chemical filter may be disposed at a downstream of the above-described filter and the inert gas after passing through the chemical filter may be fed into the chambers via a path independent from the fan filter unit 19. When a flow amount of inert gas can be barely ensured due to existence of the chemical filter, a plurality of lines may be provided to ensure the flow amount. That is, the inert-gas supply system according to the present invention is a gas supply system independent from the FFU and defined as a system in which a filter is not disposed in or near the chamber.

Next, an actual operation flow of the system according to the present invention will be described with reference to a flowchart of FIG. 2. In the system in this case, the second supply-amount control valve 65 includes two modes of the supply mode of a large flow amount and the supply mode of a small flow amount. When an initial state having a sign of "INITIAL" is obtained (so-called starting up an apparatus), the first door 17 and the second door 39 are in a state of substantially closing the first opening portion 15 and the second opening portion 37 respectively. With the state kept, the supply mode of a large flow amount is selected for the second supply-amount control valve 65 to perform the nitrogen purge in the second chamber 31. As described above, in order to discharge the dust in the second chamber 31 to the outside, the door, the second discharge port 49 and the third discharge port 51 may be fully opened and all the discharge system in the system may be used. With the state kept, a large flow amount of nitrogen can be fed and discharged into/from the second chamber 31 to discharge from the chamber the microparticles such as the dust existing in the chamber and oxidation molecules that exist therein or adhere on the wall of the chamber. The operations described above are illustrated in step SS1 in FIG. 2. After the operations are performed for a predetermined time, or after it is confirmed that the partial pressure of oxygen in the chamber becomes a predetermined value or lower, the second chamber 31 is made to be a substantially sealed space, and the mode for supplying nitrogen is switched to the supply mode of a small flow amount.

In a subsequent stand by state, nitrogen is supplied in the supply mode of a small flow amount for the second chamber 31 to maintain a so-called purified state in which the partial pressure of the oxidation gas is low and the microparticles are discharged after the purge has been completed (step SS2). The operations described in step SS2 are performed at any time except for when starting up the apparatus and when circumstance in the second chamber 31 needs to be maintenanced. For the first chamber 11, the so-called clean air from which the dust is removed is supplied from the fan filter unit 19 to purify the inside of the first chamber 11 by discharging the dust with the down flow of the clean air (step SF1). In a stand by state, the first discharge port 25 is set to ensure an enough amount of discharging air to enable the down flow fed from the fan filter unit 19 to keep an enough flowing speed.

When the wafer is taken out of/put into the pod 2, the operation of the fan filter unit 19 is stopped and the gas outlet of the fan filter unit 19 is spacially separated from the first chamber 11 by the FFU shutter 23. Further, at the same time as the above-described operations are completed, nitrogen is supplied from the first inert-gas supply system 21 into the first chamber 11 (step SF2). At this point, the first supply-amount control valve 63 is controlled to supply an amount of nitrogen equivalent to that of the air supplied from the FFU 19. After such operations for switching the flows are completed, or in parallel with the operations, the pod 2 is placed on the placing base 5. The pod 2 is secured by clamp with securing means 7 on the placing base 5 and driven in a direction toward the first opening portion 15 by the pod driving mechanism 8 after being secured. When the cap of the pod 2 abuts on the first door 17, the cap is adsorbed and held by the cap holding mechanism 18 disposed on the first door 17. After such operations (step S1) are completed, the first opening portion 15 is opened by the first door 17.

After the first opening portion 15 is opened, the first door 17 is moved by the first door-driving mechanism 16 along an arrow D in FIG. 1A, and moved back to a stand by position below the first opening portion 15 (step S2). According to the present invention, a structure in which nitrogen is directly fed into an inside of the pod 2 described above to perform the nitrogen purge is not disposed. However, in a case where the structure is disposed, a so-called side purge may be performed in the structure after the first door 17 is moved back (step S02). When a predetermined time has passed after such operations have been performed, or when it is confirmed that the partial pressure of the oxidation gas in the first chamber 11 becomes a certain level or lower, a closed state of the second opening portion 37 by the second door 39 is released (step S3). In this state, since the amount of the oxidation gas in the first chamber 11 is decreased to a predetermined amount or smaller, even if the first chamber 11 is connected to the second chamber 31, the oxidation gas in the second chamber 31 is not increased. At the same time, a closed state of the third opening portion 47 by the processing-chamber door 45 is also released. These operations enable a transfer operation of the wafer by the transfer robot 43 between the inside of the pod 2 and the processing chamber (not illustrated) to be performed.

After the operations described in step S3 are completed, the wafer is transferred by the transfer robot 43 (step S4). Generally, upon transferring one wafer into the processing chamber, the processing chamber is separated from the second chamber 31 by the processing-chamber door 45 to perform the processing on the wafer. After the processing is completed, the processing-chamber door 45 enables the processing chamber to connect to the second chamber 31, and the processed wafer is transferred to the pod. Further, in this case, when the plurality of pods are adopted to be simultaneously loaded into the system as illustrated in FIG. 1B, for example, a wafer that has transferred from one of the pod 2 is transferred to the other pod 2 after processed. Generally, since the time necessary for these operations is shorter than the time necessary for the pod that is not secured to the system, the first chamber 11 is always kept connected to the second chamber 31 during the operations.

When the transfer of the wafer is completed, and when the operations of transferring the wafer to/from the pod 2 is all completed, the first chamber 11 is spacially separated from the second chamber 31 by the second door 39 (step S5). More specifically, the second opening portion 37 is closed by the second door 39 (step S5). Sequentially, the first opening portion 15 is closed by the first door 17 and the opening of the pod 2 is closed by the cap thereof held by the first door 17 (step S6). After the cap is fixed to the opening of the pod 2, releasing of holding the cap by the first door 17, moving back of the pod to the placing position, and releasing the pod from being secured onto the placing base are continuously performed (step S7). Upon completion of such operations, the pod 2 completes the processing related to the system and is transferred to the subsequent processing system.

Upon completing Step S6 described above, the first chamber 11 is spacially separated from the second chamber 31 and from the inside of the pod 2. Therefore, since necessity of controlling the oxidation gas in the first chamber 11 is decreased, a state proceeds to the stand by state in which the supply of nitrogen is stopped and only the dust by supplying the air is controlled. Specifically, stopping to supply nitrogen from the first inert-gas supply system 21, moving back of the FFU shutter 23, and generation of the down flow by the air from the fan filter unit 19 are continuously performed. By such operations, the first chamber 11 is returned to the stand by state in which only the dust is controlled as described above (step SF3). Here, step SF3 is similar to step SF1 that is the previous stand by state. When the pod is loaded, the operations of the above-described step SF2 and steps S1 to S7 are performed once again.

Performing such operations enables a possibility to be drastically decreased in which the inside of the second opening portion 37 gets contaminated by the oxidation gas every time the pod 2 is loaded. Since passing through the outer space, the cap of the pod is most likely to bring the dust into the purified space. Thus, the cap is brought only into the first chamber 11 that is minute and in which a large flow amount can be generated. Further, dust in the first chamber 11 can be controlled rapidly and securely. Therefore, without generating the down flow in the second chamber 31, only a slight amount of nitrogen is supplied to maintain higher pressure in the second chamber 31 than that in the first chamber 11 so that the purified environment in the second chamber 31 can be easily maintained. Further, when the wafer is moved in the first chamber 11, or when the inside of the pod for holding the wafer is connected to the insides of the second chamber 31 and first chamber 11 where purified state is maintained, the fan filter unit 19 is disposed at a position spacially apart from the first chamber 11. Further, nitrogen is supplied into the first chamber 11 via a path different from the fan filter unit 19. Accordingly, a possibility in which impurities such as boron caused by the fan filter unit 19 are dispersed or mingled onto the wafer or into the purified space can be greatly decreased.

According to the present exemplary embodiment described above, the gap is formed between the opening portion and the door. However, the present invention is not limited to the present exemplary embodiment, and for example, it may be constructed such that only the second opening portion 37 is completely closed or both of the opening portions are completely closed. Further, the placing base 5 is disposed in parallel in one-to-one correspondence, however, the number of the placing base to be placed is not limited to such number. That is, the first chamber corresponding to a size of the placing base may be disposed for each placing base, and a predetermined second chamber corresponding to the first chamber, or a second chamber that can corresponds to all first chambers may be disposed. Furthermore, when displacing the inert gas supply system for purging of another system that can purge nitrogen in the pod as described above, the first inert-gas supply system 21 may be adopted as a system for supplying so-called dry clean air in which an amount of included moisture and the dust are controlled. In a process of producing semiconductors, moisture included in air often causes problems more than oxygen. If the insides the pod and second chamber are maintained as a space having sufficiently high concentration of nitrogen, the time when the wafer is moved in the air is very short. Thus, it is considered that various kinds of the films will not be substantially, greatly oxidized.

As many apparently widely different embodiments of the present invention can be made without departing from the spirit and scope thereof, it is to be understood that the invention is not limited to the specific embodiment thereof except as defined in the appended claims.

This application claims priority from Japanese Patent Application No. 2008-001036 filed Jan. 8, 2008, which is hereby incorporated by reference herein.

What is claimed is:

1. A transfer system for a contained object that transfers the contained object between a container and a processing chamber in which processing is performed on the contained object, the container being capable of containing the contained object therein and including a main unit in a substantially box-like shape having an opening on one face thereof and a cap capable of being separated from the main unit and closing the opening to form a sealed space together with the main unit, and the cap being removed from the container to open the opening so that the contained object is able to be taken out of and put into the container, the transfer system comprising:
 a placing base on which the container is placed;
 a first chamber that is disposed adjacent to the placing base and includes a first opening portion facing the container placed on the placing base;
 a first door capable of closing the first opening portion and holding the cap of the container;
 a fan filter unit for supplying an air down flow of clean air into the first chamber disposed above the first chamber;
 a first inert-gas supply system disposed above the first chamber independently from the fan filter unit for supplying a first inert gas down flow of inert gas into the first chamber;
 a first discharge system capable of discharging gas existing in the first chamber;
 a second chamber that is disposed adjacent to the first chamber, capable of connecting to the first chamber via a second opening portion, and capable of connecting to the processing chamber via a third opening portion;
 a second door capable of closing the second opening portion;
 a second inert-gas supply system for supplying a second inert gas down flow of inert gas into the second chamber;
 a second discharge system capable of discharging gas existing in the second chamber;
 a transfer robot that is disposed in the second chamber and transfers the contained object between an inside of the container and the processing chamber; and
 a control apparatus that controls the fan filter unit and the first inert-gas supply system, and detects whether the container is placed on the placing base or not,
 wherein the control apparatus causes the fan filter unit to supply the air down flow into the first chamber in a state that the container is not placed on the placing base, and
 the control apparatus causes the fan filter unit to stop supplying the air down flow and causes the first inert-gas supply system to supply the inert gas down flow into the first chamber upon detecting a state that the container is placed on the placing base.

2. The transfer system according to claim 1, further comprising a shutter member that is disposed near an outlet of the clean air from the fan filter unit and capable of spatially separating the outlet from the first chamber,
 wherein the control apparatus stops supplying the clean air from the fan filter unit and enables the shutter member to spatially separate the outlet from the first chamber.

3. The transfer system according to claim 1,
 wherein the second inert-gas supply system has a supply mode of a large flow amount for supplying the inert gas with a large flow amount into the second chamber and a supply mode of a small flow amount for supplying the inert gas with a small flow amount into the second chamber, in order to maintain a purity level of the inert gas in the second chamber.

4. The transfer system according to claim 3,
 wherein, when the second inert-gas supply system supplies the inert gas into the second chamber in the supply mode of the small flow amount, the control apparatus controls at least either one of the second inert-gas supply system or the second discharge system to maintain pressure within the second chamber being higher than pressure within the first chamber.

5. The transfer system according to claim 1,
 wherein the second inert-gas supply system supplies inert gas with a small flow amount in order to maintain a purity level of the inert gas in the second chamber; and wherein the control apparatus enables the second door to open the second opening portion and the first discharge system to stop a discharge operation, and has a purge mode for feeding the inert gas supplied from the first inert gas supply system into the second chamber via the first chamber.

6. The transfer system according to claim 1, wherein a plurality of first chambers are provided, and the fan filter unit, the first inert-gas supply system, the second opening portion, and the second door are each provided for each of the first chambers.

7. A transfer system according to claim 1, wherein the control apparatus controls the first inert-gas supply system to supply the first inert gas down flow into the first chamber, so as to control a flow amount of the first inert gas down flow equivalent to a flow amount of the air down flow, upon detecting a state where the container is placed on the placing base.

* * * * *